United States Patent
Crichlow

(10) Patent No.: US 6,900,738 B2
(45) Date of Patent: May 31, 2005

(54) METHOD AND APPARATUS FOR READING A METER AND PROVIDING CUSTOMER SERVICE VIA THE INTERNET

(76) Inventor: Henry Crichlow, 330 W. Gray St., Suite 504, Norman, OK (US) 73069-7141

( * ) Notice: Subject to any disclaimer, the term of this patent is extended or adjusted under 35 U.S.C. 154(b) by 505 days.

(21) Appl. No.: 09/884,159

(22) Filed: Jun. 19, 2001

(65) Prior Publication Data

US 2002/0018545 A1 Feb. 14, 2002

Related U.S. Application Data

(60) Provisional application No. 60/213,070, filed on Jun. 21, 2000.

(51) Int. Cl.$^7$ ............................................... G08C 15/06
(52) U.S. Cl. ............................ 340/870.02; 340/870.07; 702/57; 705/412
(58) Field of Search ...................... 340/870.02, 870.07; 702/57; 705/400, 412

(56) References Cited

U.S. PATENT DOCUMENTS

| | | | |
|---|---|---|---|
| 3,922,492 A | 11/1975 | Lumsden | |
| 4,035,772 A | 7/1977 | Abe et al. | |
| 4,394,540 A | 7/1983 | Willis et al. | |
| 4,713,837 A | * 12/1987 | Gordon | 379/106.07 |
| 5,140,351 A | 8/1992 | Garcia et al. | |
| 5,161,182 A | 11/1992 | Merriam et al. | |
| 5,459,459 A | 10/1995 | Lee, Jr. | |
| 5,699,276 A | * 12/1997 | Roos | 379/106.03 |
| 5,748,104 A | 5/1998 | Argyroudis et al. | |
| 5,751,797 A | 5/1998 | Saadeh | |
| 5,767,790 A | 6/1998 | Jovellana | |
| 5,808,558 A | 9/1998 | Meek et al. | |
| 5,852,658 A | 12/1998 | Knight et al. | |
| 5,897,607 A | * 4/1999 | Jenney et al. | 702/62 |
| 6,169,979 B1 | * 1/2001 | Johnson | 705/412 |
| 2001/0039537 A1 | * 11/2001 | Carpenter et al. | 705/400 |
| 2002/0091653 A1 | * 7/2002 | Peevey | 705/412 |
| 2003/0009301 A1 | * 1/2003 | Anand et al. | 702/62 |
| 2003/0158826 A1 | * 8/2003 | Burke et al. | 705/412 |

* cited by examiner

Primary Examiner—Timothy Edwards, Jr.
(74) Attorney, Agent, or Firm—Michael I. Kroll

(57) ABSTRACT

A method and system for monitoring usage of a utility at a remote location by a central station and incorporates a real time method for optimizing energy costs operationally by combining optimization algorithms and real time pricing data to lower costs to the energy user. The system includes a meter reading module for determining an amount of usage at the remote location and generating a data signal indicative of the determined amount of usage and a personal computer (PC) located at the remote location and connected to the meter reading module. The PC is connectable to the internet for receiving and storing the data signal from the meter reading module for transmission to a processor located at the central location via the internet. The meter reading module is connected to one of an electrical, gas or water meter. The processor determines an amount of usage of the utility based upon the data signal. The meter reading module is connected to the PC via one of a hardwired connection, X-10 technology or sent over existing telephone lines. The processor is able to generate a bill based upon a determined amount of usage and transmit the bill to the PC in the form of one of an e-mail message, Internet browser or other Internet related technologies. Payment of the bill by the PC at the remote location is performed automatically over the Internet via online banking protocols or other internet related payment technologies.

25 Claims, 16 Drawing Sheets ns application is subject to U.S. provisional application Ser. No. 60/213,070, filed Jun. 21, 2000 and please incorporate by reference all information in referenced provisional application into this instant application.

METHOD AND APPARATUS FOR READING A METER AND PROVIDING CUSTOMER SERVICE VIA THE INTERNET

This application is subject to U.S. provisional application Ser. No. 60/213,070, filed Jun. 21, 2000 and please incorporate by reference all information in referenced provisional application into this instant application.

BACKGROUND OF THE INVENTION

1. Field of the Invention

The present invention relates to a method and apparatus for obtaining measurement data from metering systems, such as those for measuring electric, gas and water use and, more particularly, to a method of transferring data obtained over the Internet, the data being used for optimizing customer energy use via a set of optimizing algorithms in a real time framework.

The present invention further relates to a new and unique type of e-commerce enabling an internet company to use the existing internet as a structural backbone and communications conduit, to save money for both energy users and producers by utilizing the capabilities of an internet company to act as an internet portal between consumers at all levels and energy and power producers.

2. Description of the Prior Art

Numerous types automatic meter readers have been provided in the prior art wherein a signal from the meter is recorded and then transferred to a utility company. Most devices optically read the meter wheel as it revolves. Utility and other companies that provide electricity, gas and water have used a combination of technologies to perform these services such as hand held systems, optical systems, driveby systems, hard wired systems and even the power distribution line themselves. Regardless of the system the basic reason for utilization is to increase efficiency and reduce costs by the utility.

There are several devices and systems in the prior art for remote reading of meters. An example of such a system is described by Lumsden in U.S. Pat. No. 3,922,492. This patent describes a system for remotely reading, storing and transmitting the reading of a meter to a central computer. The computer automatically sends a signal by telephone to interrogate the meter which is fitted with a transponder. The stored information in the transponder is relayed back to the computer.

U.S. Pat. No. 4,035,772 issued to Takeshi teaches a system in which a central computer terminal is connected to a series of remote computer terminals which have previously stored the meter readings. In Takeshi, the terminals replace the transponders of the Lumsden invention.

U.S. Pat. No. 4,394,540 issued to Willis uses a coded signal over the telephone network to interrogate a meter reader. This system involves a microprocessor as the meter reader, a telephone isolation device, a call answering device, various detection devices, a data transmitter and a modem.

U.S. Pat. No. 5,140,351 issued to Garcia uses a coherent fiber optic link which actually provides a visual signal of each digit of the meter. The visual image is then transferred to a central receiving location.

U.S. Pat. No. 5,161,182 issued to Merriam details a system in which utility computers are coupled by modem to the individual sites which have meter sending units. Each meter sending unit has a microprocessor which counts the pulses emitted for each unit consumption of power and stores this count in RAM. This count is transformed into a tone which is transmitted over the phone lines to the central computer.

A wireless telemetry system to provide real time reading and control of meters using the existing wireless networks connecting meter transmitting units and central receiver units is disclosed in U.S. Pat. No. 5,748,104 issued to Argyroudis. In the described embodiment the remote metering unit is a basic transceiver coupled to a preexisting conventional electromechanical utility meter by an interface device.

U.S. Pat. No. 5,459,459 issued to Lee describes an algorithm for reading revenue from an electronic register by reading, tabulating, storing and transmitting the data to a central site.

U.S. Pat. No. 5,808,558 issued to Meek describes a universal data gathering system that can interact with different types of operating systems. It consists of three elements. The first element is a universal transponder which accumulates the data, the second element is a meter interface unit which connects the transponder to the data gathering system, and the third element is a universal data reader. Each part of the system can be polled by any remote unit which responds with the appropriate protocol. This invention hopes to overcome the diverse operating protocols used by different meter companies.

U.S. Pat. No. 5,852,658 issued to Knight describes a remote automatic monitoring and recording system which comprises an electronic meter reader, a data concentrator, a telephone interface, a billing computer and a telephone modem. Knight uses three telephone lines to operate the system.

U.S. Pat. No. 5,767,790 issued to Jovellana also describes an automatic utility meter reader and monitor for electric, gas and water. This invention provides communication from the utility to the meter unit using a standard computer modem link which transmits commands from the utility to the meter reading system. The automatic meter unit has a compiler for interpreting commands from the host computer unit.

U.S. Pat. No. 5,751,797 issued to Saadeh uses a plurality of computer modems connected to a single computer and to a series of automatic meter reading devices. The single computer sequentially polls each meter reading device using the appropriate modem link. This link allows the system to send control data to the meter reading devices and also allows the meter reading devices to send data back to the central computer.

Several companies (Cellnet, Aim Technologies, Itron) have developed the technology and devices that allow the energy meter to be read remotely. Most devices read the meter remotely and then transmit the signal either by hardwire, by public telephone, by wireless system, by cellular phone and even by the power transmission wire itself. Currently used technology for transmission of the data read by the meters is shown in FIG. 1. This figure illustrates a power company 10 providing power to a customer via the customer meter 12. The customer meter 12 monitors the amount of power being provided by the power company 10. Connected to the customer meter 12 is a meter reading module 14. The meter reading module 14 reads the customer meter 12 to determine the amount of power used by the customer. The meter reading module 14 then provides a signal indicative of the determined amount of power back to the power generating utility 10. The signal provided by the meter reading module 14 is provided to the power generating utility via any one of a private hardware network 16, a wireless communications network 18, a public communications network 20 and existing electrical power lines 24. A technology commonly called X-10 technology allows digital signals to be transmitted over the existing electric wiring in the building.

There are also several companies that are currently using a bill presentment process over the internet where the company sends the customer an e-mail including a bill over the internet. The customer can see and review their bills on the computer screen. This technology is not specifically geared to the utility system but is designed for any type of paper bill and is part of the general evolution to the paperless society of electronic billing. The Edocs system is designed to utilize existing payment technologies that exist in online commerce today in which the customers can elect to pay their bill using various electronic check and credit card systems.

While these units may be suitable for the particular purpose to which they address, they would not be as suitable for the purposes of the present invention as heretofore described.

SUMMARY OF THE PRESENT INVENTION

The present invention relates to a method and apparatus for obtaining measurement data from metering systems, such as those for measuring electric, gas and water use and, more particularly, to a method of transferring data obtained over the Internet, the data being used for optimizing customer energy use via a set of optimizing algorithms in a real time framework.

A primary object of the present invention is to provide a system for automatically reading an electric meter that will overcome the shortcomings of prior art devices.

Another object of the present invention is to provide a system for automatically reading an electric meter at a customer location and transmitting the meter information to a customer computer and then to the utility or energy company site using the Internet.

A further object of the present invention is to provide a system for automatically reading an electric, natural gas or water meter at the customer location and transmitting the meter information to the customer computer using the existing wiring in the customer location to carry the data signal from the meter to the customer PC.

A further object of the present invention is to provide a system for automatically reading an electric, natural gas or water meter at the customer location and transmitting the meter information to the customer computer using a hard wire connection to carry the data signal from the meter that is read to the customer PC.

A still further object of the present invention is to provide a system for automatically reading an electric, natural gas or water meter at the customer location and transmitting the meter information to the customer computer using existing telephone wires in the building to carry the data signal from the meter that is read to the customer PC.

A yet further object of the present invention is to provide a system for automatically reading an electric, natural gas or water meter at the customer location and transmitting the meter information to the customer computer using wireless technology to carry the data signal from the meter that is read to the customer PC.

An even further object of the present invention is to provide a system for automatically reading a natural gas meter at the customer location and transmitting the meter information to the customer computer and then to the utility or energy company site using the Internet. The natural gas meter can be read directly or by an encoder connected to the device and used to read the electric meter at the customer location.

Another object of the present invention is to provide a system for automatically reading a water meter at the customer location and transmitting the meter information to the customer computer and then to the utility or energy company site using the Internet. The water meter can be read directly or by an encoder connected to the device and used to read the electric meter at the customer location.

A still further object of the present invention is to provide a system for automatically reading one, two or three meter types simultaneously at the customer location and transmitting the meter information to the customer computer and then to the utility or energy company site using the Internet.

An even further object of the present invention is to provide a system for automatically signaling the customer's PC, even when the customer's PC is not connected to the Internet, wherein the utility server calls the customer PC and signals the customer's machine telephone modem to connect to the Internet, thereby allowing for more efficient use of the internet by utilizing interactive two-way communication between customer and utility. After the PC is connected to the Internet the meter data is uploaded to the utility server.

Another object of the present invention is to provide a system for providing a data warehouse of information for use by utility companies. The data warehouse being a massive historical database of all the customer profiles collected by the system from the use of electric, natural and water resources by the utility customers.

A yet further object of the present invention is to provide a system for automatically billing the customer over the Internet via e-mail, Internet browser or other Internet related technologies.

A still further object of the present invention is to provide a system able to transmit a data signal indicative of a meter reading from the customer PC in either a foreground or background mode while the user is connected to the Internet and without customer intervention using a resident program in the customer PC.

An even further object of the present invention is to provide a system for allowing the customer to pay their bills automatically over the Internet via online banking protocols or other internet related payment technologies.

Another object of the present invention is to provide a system for automatically determining the working status of the customer's electric, natural gas or water system over the internet during times of outages and other disaster related incidents. When the meter is offline or power is out there is a special outage signal code from the PC device sent over the computer modem to the main server.

A yet further object of the present invention is to provide a system for automatically reading the customer's meters over the internet via e-mail, internet browser or other internet related technologies without the need for new expensive hardwired or wireless dedicated network systems.

A still further object of the present invention is to provide a system for automatically providing the customer with energy costs over the internet via e-mail, internet browser or other internet related technologies by allowing the access to published utility company tariffs which are kept on a server database.

Another object of the present invention is to provide a system for automatically providing the customer with validated energy costs over the internet via e-mail, internet browser or other internet related technologies by recomputing the customer bills using the published tariff schedules of the utility.

A yet further object of the present invention is to provide a system for automatically optimizing electric power us e at the customer location by using a combination of linear and non-linear optimizing algorithms and "time of day" or "real time pricing per Kwhr" data. This allows the customer to minimize total energy costs by using power at times that minimize costs but still meet all the required constraints for customer electric power use. This allows the energy end user to select the equipment such that the hourly use of power keeps the total energy cost at a minimum without affecting commercial and industrial operations.

Another object of the present invention is to provide a system that is simple and easy to use.

A still further object of the present invention is to provide a system that is economical in cost to manufacture.

Additional objects of the present invention will appear as the description proceeds.

A method and system for monitoring usage of a utility at a remote location by a central station is disclosed by the present invention. The system includes a meter reading module for determining an amount of usage at the remote location and generating a data signal indicative of the determined amount of usage and a personal computer (PC) located at the remote location and connected to the meter reading module. The PC is connectable to the internet for receiving and storing the data signal from the meter reading module for transmission to a processor located at the central location via the internet. The meter reading module is connected to one of an electrical, gas or water meter. The processor determines an amount of usage of the utility based upon the data signal. The meter reading module is connected to the PC via one of a hardwired connection, X-10 technology or sent over existing telephone lines. The processor is able to generate a bill based upon a determined amount of usage and transmit the bill to the PC in the form of one of an e-mail message, Internet browser or other Internet related technologies. Payment of the bill by the PC at the remote location is performed automatically over the Internet via online banking protocols or other internet related payment technologies.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING FIGURES

Various other objects, features and attendant advantages of the present invention will become more fully appreciated as the same becomes better understood when considered in conjunction with the accompanying drawings, in which like reference characters designate the same or similar parts throughout the several views.

DESCRIPTION OF THE REFERENCED NUMERALS

Figure 1:
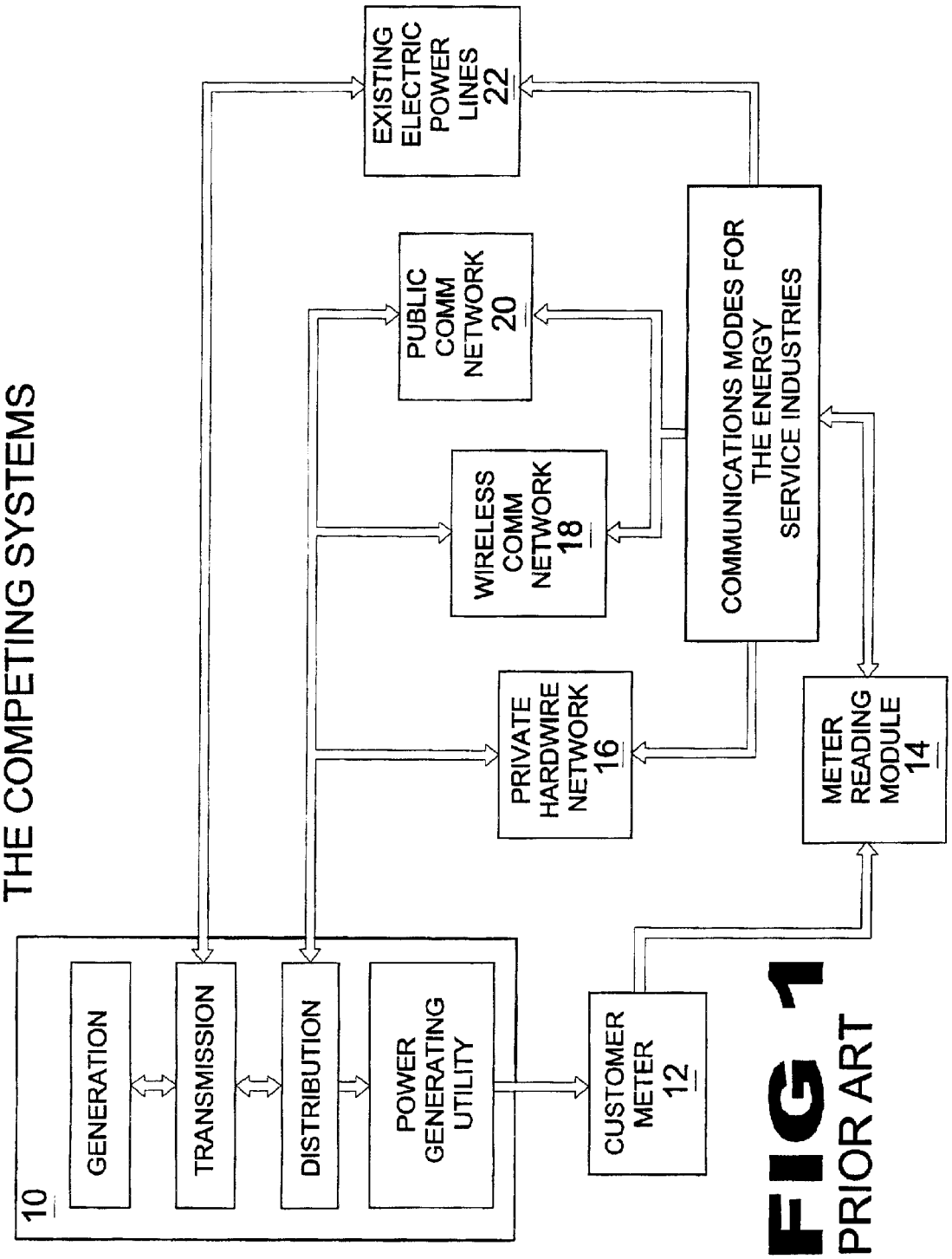
FIG. 1 is a block diagram of a prior art system used for communication of data in the energy services industries.

Turning now descriptively to the drawings, in which similar reference characters denote similar elements throughout the several views, the Figures illustrate the system for reading a meter of the present invention. With regard to the reference numerals used, the following numbering is used throughout the various drawing figures.

10 power generating utility
12 customer meter
14 meter reading module
16 private hardware network
18 wireless communications network
20 public communications network
22 existing electrical power lines
30 system for reading a meter
32 meter reading module
34 electric meters
36 energy service company
38 data packet 40 personal computer
42 connection line
44 data port
46 internet connection
48 utility server
50 internet service provider
52 gas meter
54 water meter
56 utility computers
58 data base
60 internet connection
62 client utility company
64 gang box of meters
66 internet connection line
68 electrical wires within building for connecting meter reading module to PC
70 telephone wires within building for connecting meter reading module to PC

DETAILED DESCRIPTION OF THE PREFERRED EMBODIMENT

Turning now descriptively to the drawings, in which similar reference characters denote similar elements throughout the several views, FIGS. 2 through 13 illustrate the system for reading a meter of the present invention indicated generally by the numeral 30.

Figure 2:
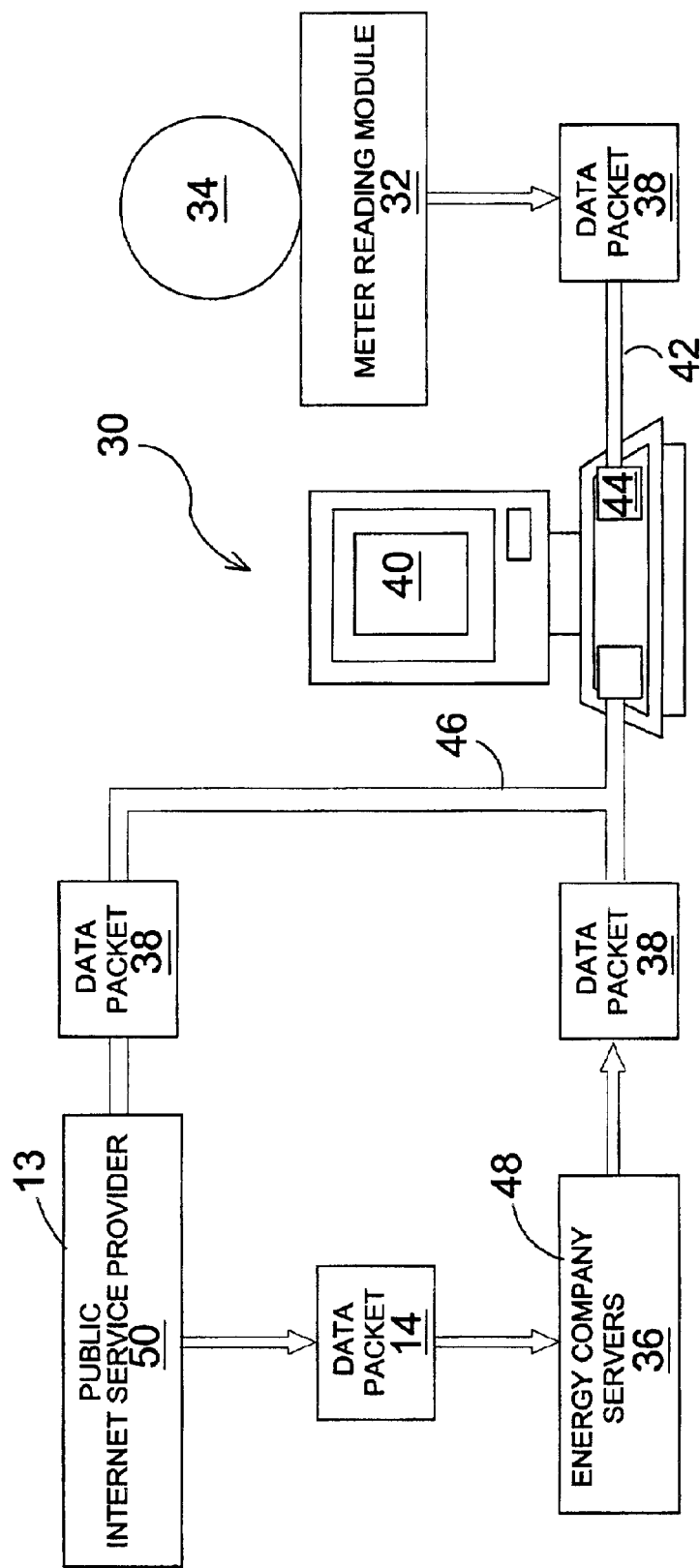
FIG. 2 is a block diagram of the system for reading a meter of the present invention.
Figure 4:
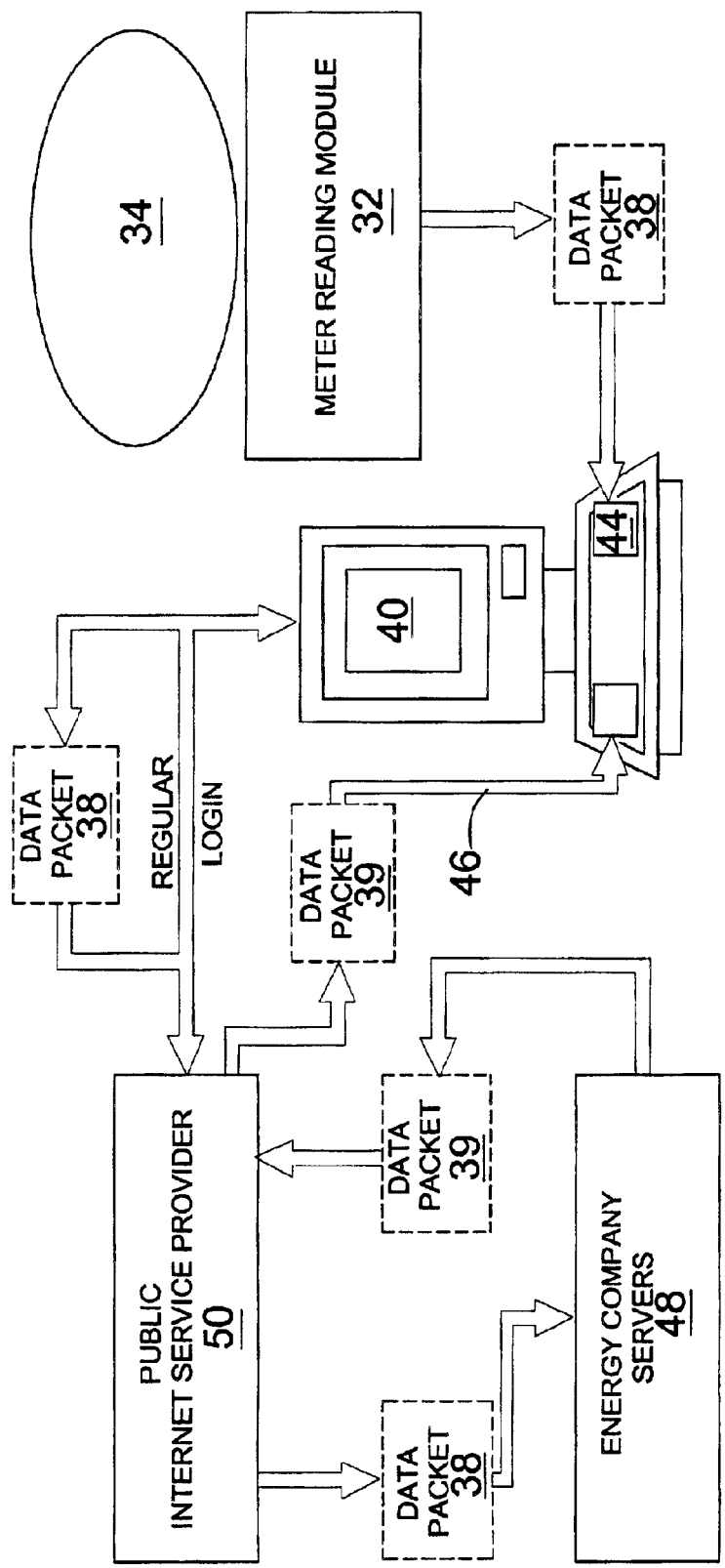
FIG. 4 is a block diagram illustrating a flow of data through the system for reading a meter of the present invention.

The system for reading a meter 30 of the present invention is illustrated in FIG. 2. This figure illustrates the flow of data from a meter reading module 32 which reads data from a meter 34 to servers 48 of the energy company 36 while FIG. 4 illustrates the flow of data from the meter reading device 32 reading data from meters 34 to the servers 48 as well as the flow from the servers 48 back to a personal computer 40 of the user. As can be seen from these figures, the system for reading a meter 30 includes the meter reading module 32 connected to the meter 34 such as an electric gas or water meter. The juxtaposition of the meter reading module 32 with respect to the meter 34 is usually under the glass of the meter 34 and the meter reading module 32 is connected by fasteners like screws to the meter 34. The meters 34 are of standard design and are familiar to all knowledgeable in the industry. The meter reading module 32, sometimes called automatic meter readers in the industry, usually operate by optically counting the revolutions of the meter wheel. The number of revolutions is converted to a Kwhr quantity by a meter constant built into the meter reading module 32. The quantitative data from the meter 34 is stored in the module 32 in a digital buffer or memory chip which is a typical buffer system used generically in the electronic industry. Several versions of the meter reading module 32 are available in the market place. The buffer is necessary since the meter readings are uploaded to an energy service company 36 in a batch mode and not normally in real time. Meter reading modules 32 can have a storage capacity of up to 90 days worth of meter data before being unloaded. The meter reading modules 32 normally and preferably are powered by lithium type batteries and are able to maintain the data even in a power outage situation. However, any power source may be used as long as the power source is able to provide sufficient power to operate the meter reading module 32. In some cases the meter reading module 32 can receive power from the meter 34 itself with the battery power being used as backup.

Figure 3:
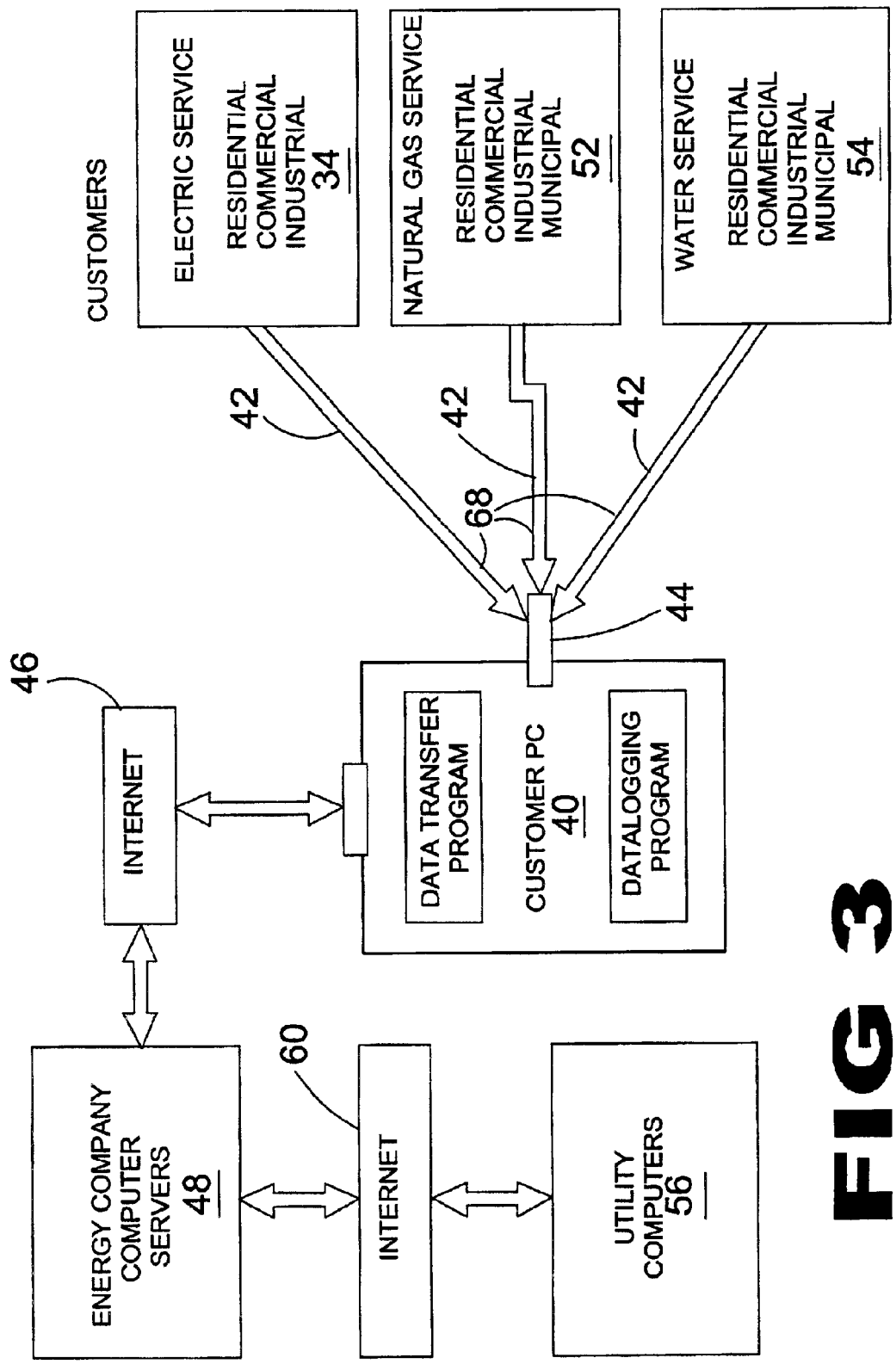
FIG. 3 is a block diagram illustrating the system for reading a meter of the present invention used to read an electric, gas and water meter.
Figure 6:
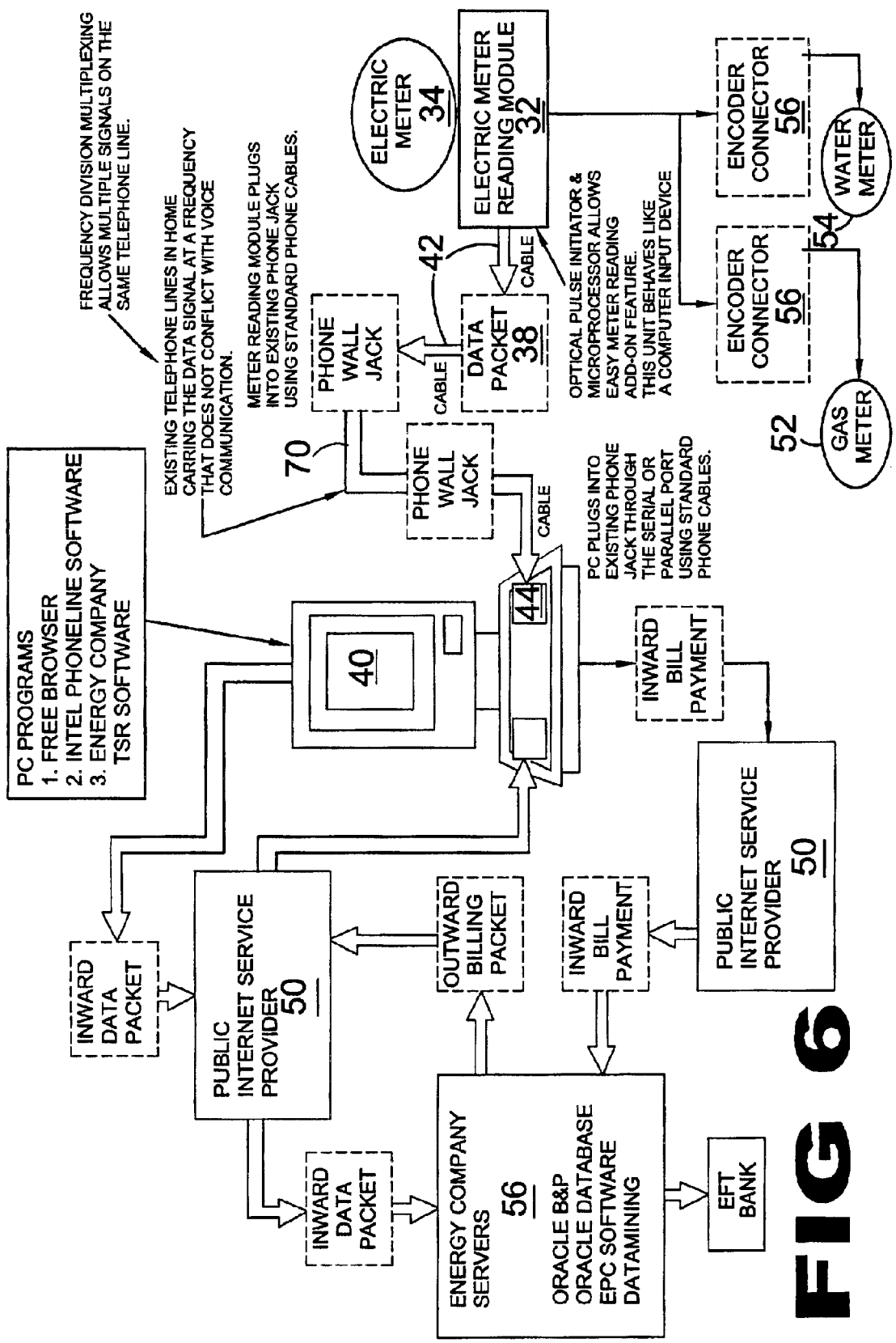
FIG. 6 is a block diagram illustrating data packet movement through the system for reading a meter of the present invention.
Figure 7:
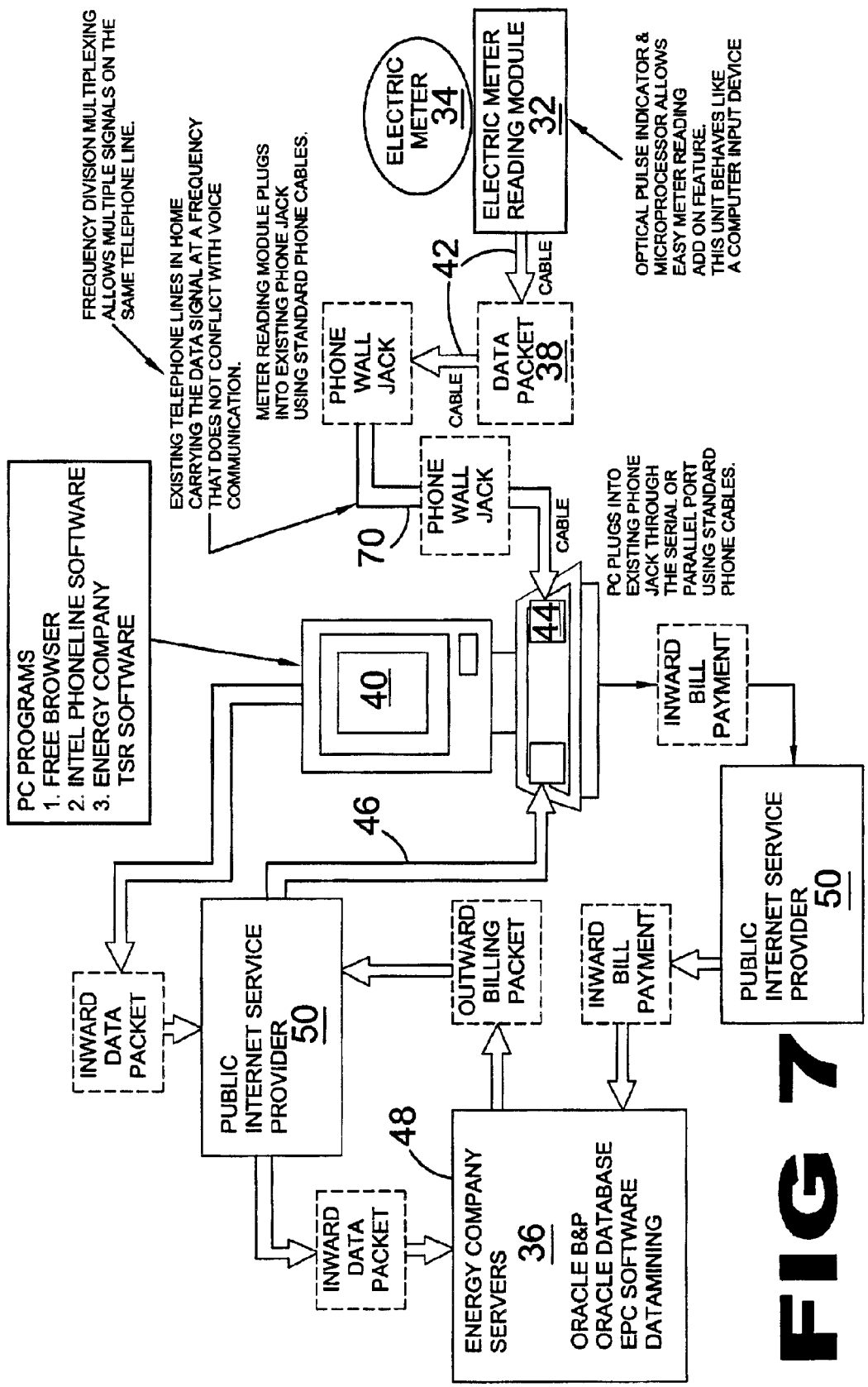
FIG. 7 is a block diagram showing the transfer of data through the system for reading a meter of the present invention when a user is logging onto the internet.
Figure 8:
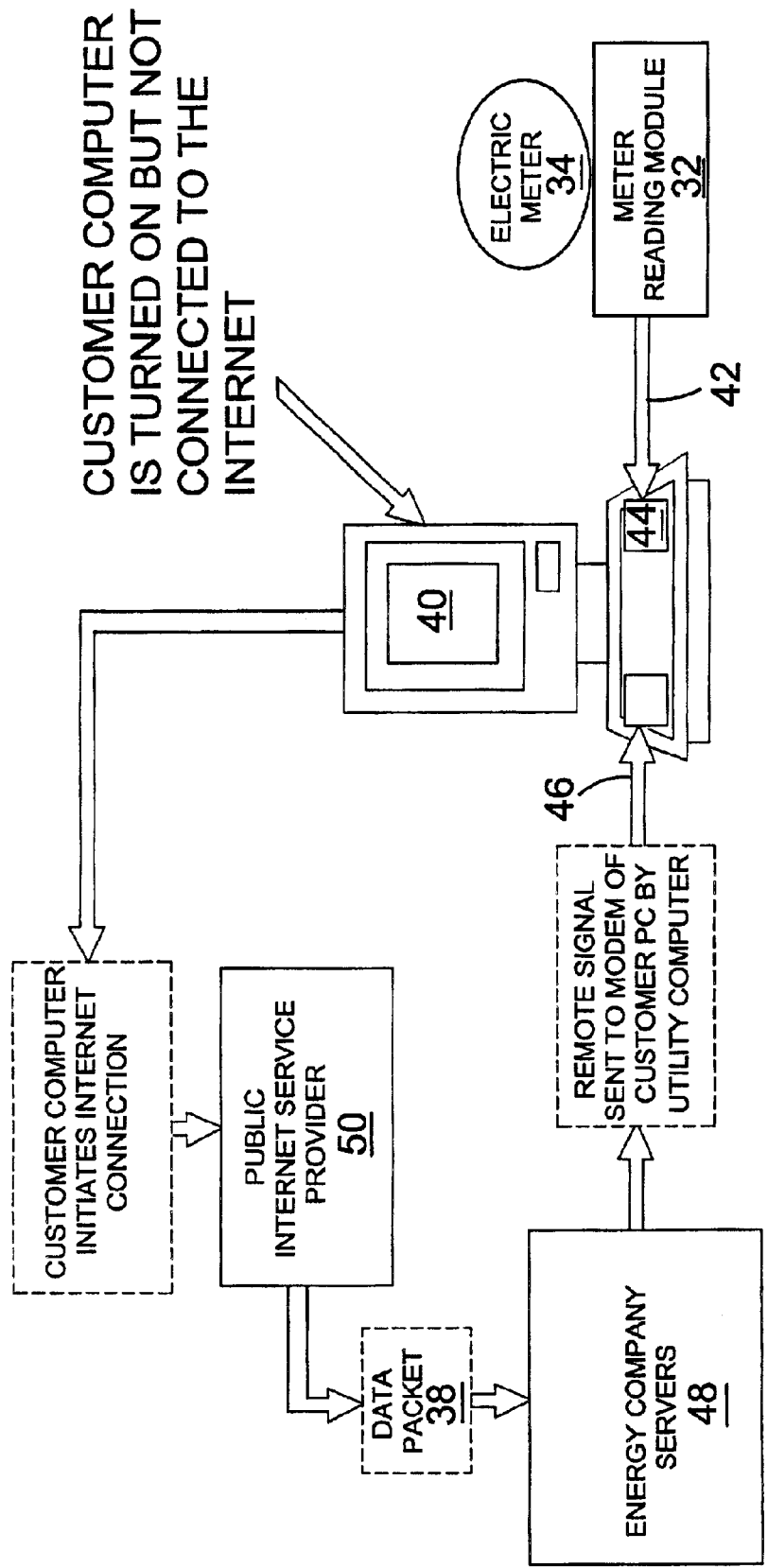
FIG. 8 is a block diagram showing the transfer of data through the system for reading a meter of the present invention when a user's computer is turned on but not connected to the internet.

Data illustrated as a data packet 38 in FIG. 2 is transferred from the buffer within the meter reading module 32 to a customer's personal computer (PC) 40 by way of a connection line 42. The connection line 42 can be either a hard-wired connection, i.e. sent over the existing electric wiring in the building, X-10 technology, i.e. wireless, or sent over existing telephone lines at a frequency that does not interfere with other regular telephone communications. FIG. 3 illustrates the connection line as the electrical wiring 68 within a building while FIGS. 6 and 7 illustrate the use of the existing telephone lines 70 as the connection line. The data is collected by the PC 40 through a data port 44 which is normally a serial or parallel port on the PC 40 computer mother board. In this embodiment a data logging program stored within the PC 40 reads the meter data from the data port 44 and stores the data on a hard drive within the PC 40 in a special directory.

When the PC user logs on to the internet, a program stored within the memory of the PC 40 is automatically initiated and this program performs the data transfer via the established internet connection 46 to the server 48 of the utility or energy company 36. These resident programs work in the background and are unnoticed by the computer user during the login session. In this embodiment, it is this novel simultaneous use of the public internet system to bridge the communications gap between the customer and the power provider that points out one of the improvements of this invention over the existing technology. There is no need for expensive, dedicated, hardwired or wireless networks that are currently being used by companies to collect AMR data and transmit the data to the utility or energy company 36.

In the event that the customer PC 40 is turned on but it is not connected to the Internet the utility server 48 uses the "off the net" technology to send a signal to a modem within the customer PC to initiate a connection with the internet 46 by dialing the internet service provider 50 and connecting the customer to the internet. This technology has been used in internet telephony but to date no one has used it in connection with meter reading functions for utility customers. When this connection is initiated, the meter data transfer programs resident in the computer 40 can be run to allow the data to be uploaded to the server 48.

Figure 5:
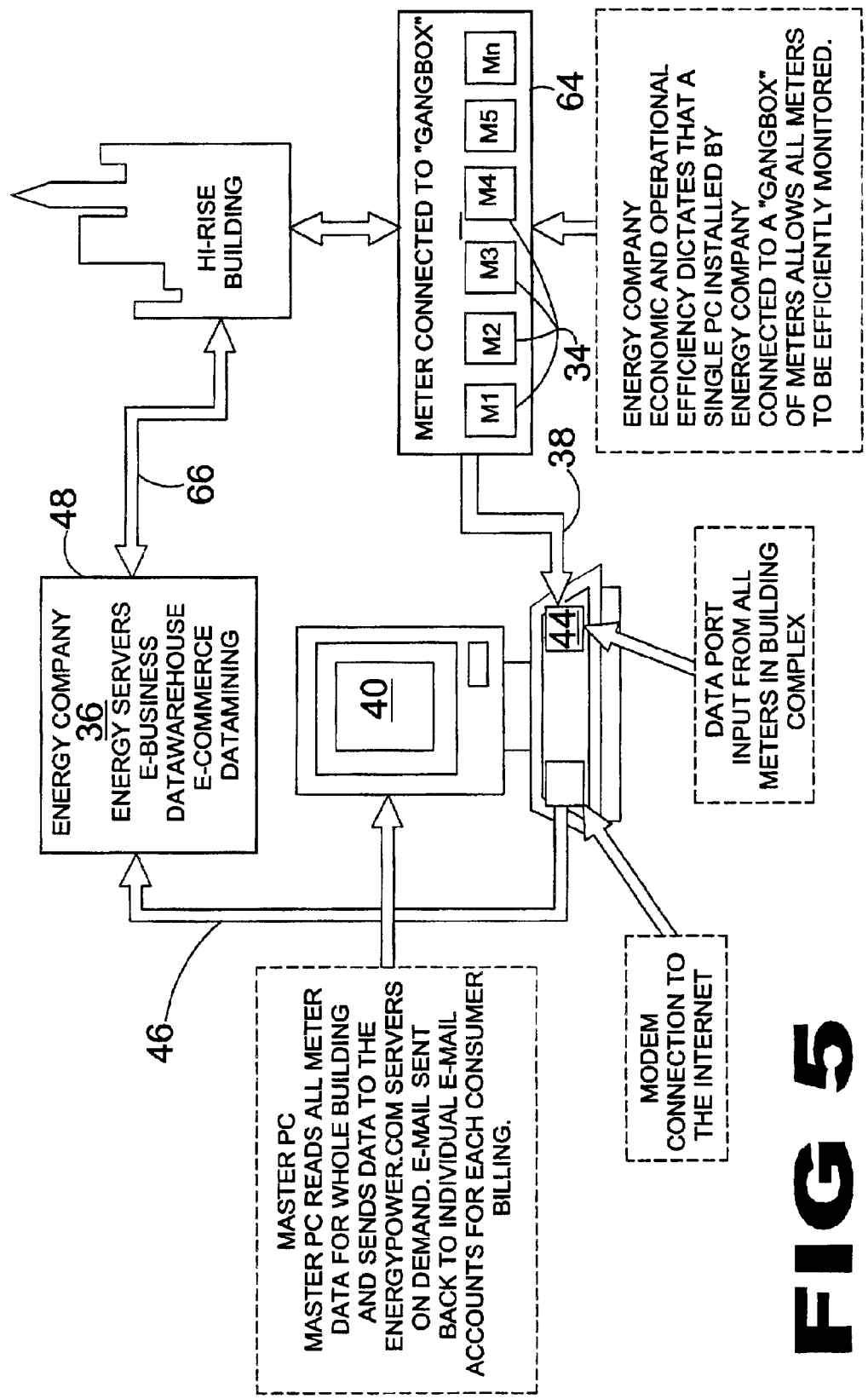
FIG. 5 is a block diagram illustrating the reading of meters within a multiple residence structure in accordance with the system for reading a meter of the present invention.

FIG. 5 illustrates the use of the system for reading a meter 30 of the present invention for use in collecting data from a plurality of meters 34 within a large building having numerous residences. In this instance the meters 34 are connected to a gang box 64 wherein each meter 34 provides data to the PC 40 via a connection line 38. The gang box 64 includes a plurality of meter reading devices 32, each connecting to a respective meter 34. The computer is able to differentiate data from each meter reading module 32 within the gang box 64 and thus also differentiate data from each meter 34. This data is transmitted to the servers of the energy company 36 upon demand and e-mail messages are transmitted back to individual e-mail accounts associated with each meter for individual customer billing via an internet connection 66.

Data from gas meters 52 and water meters 54 is collected by encoders 56 as can be seen in FIG. 6. These encoders 56 are industry standard devices and are connected in parallel to the meter reading module 32 using some of the same circuitry. The combination of these additional devices allows the preferred embodiment of the invention to simultaneously collect additional data from natural gas and water use. The collected data is segregated internally on the hard drive of the PC 40 of the customer. In this embodiment the computer servers 48 of the energy service company 36 are connected to those of the Utility company 56 as shown in FIG. 3. FIG. 6 illustrates the use of existing telephone lines 70 for connecting the meter reading modules 32 to the PC 40 for transmission of data therebetween.

Figure 9:
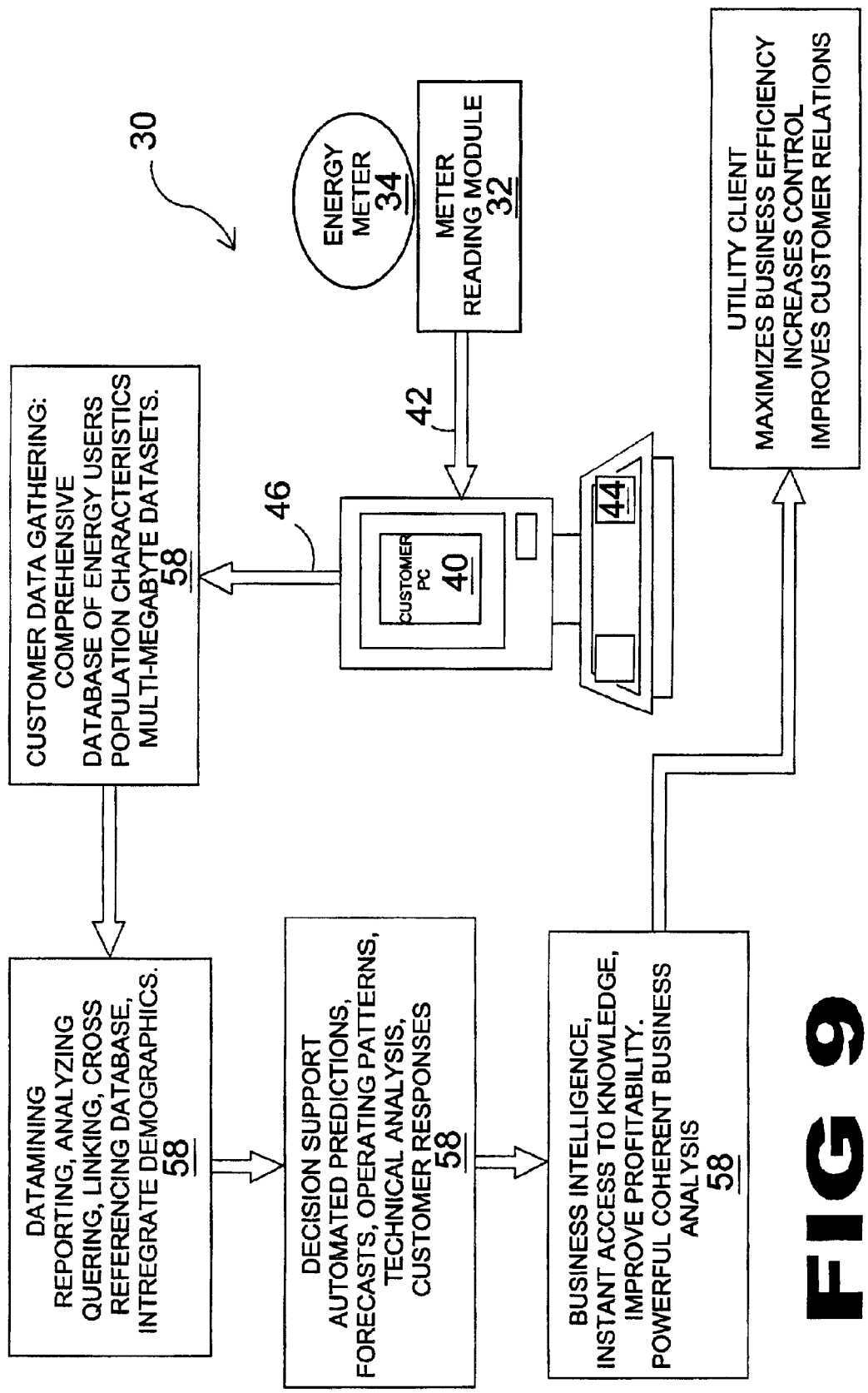
FIG. 9 is a block diagram illustrating data gathering by the system for reading a meter of the present invention.
Figure 10:
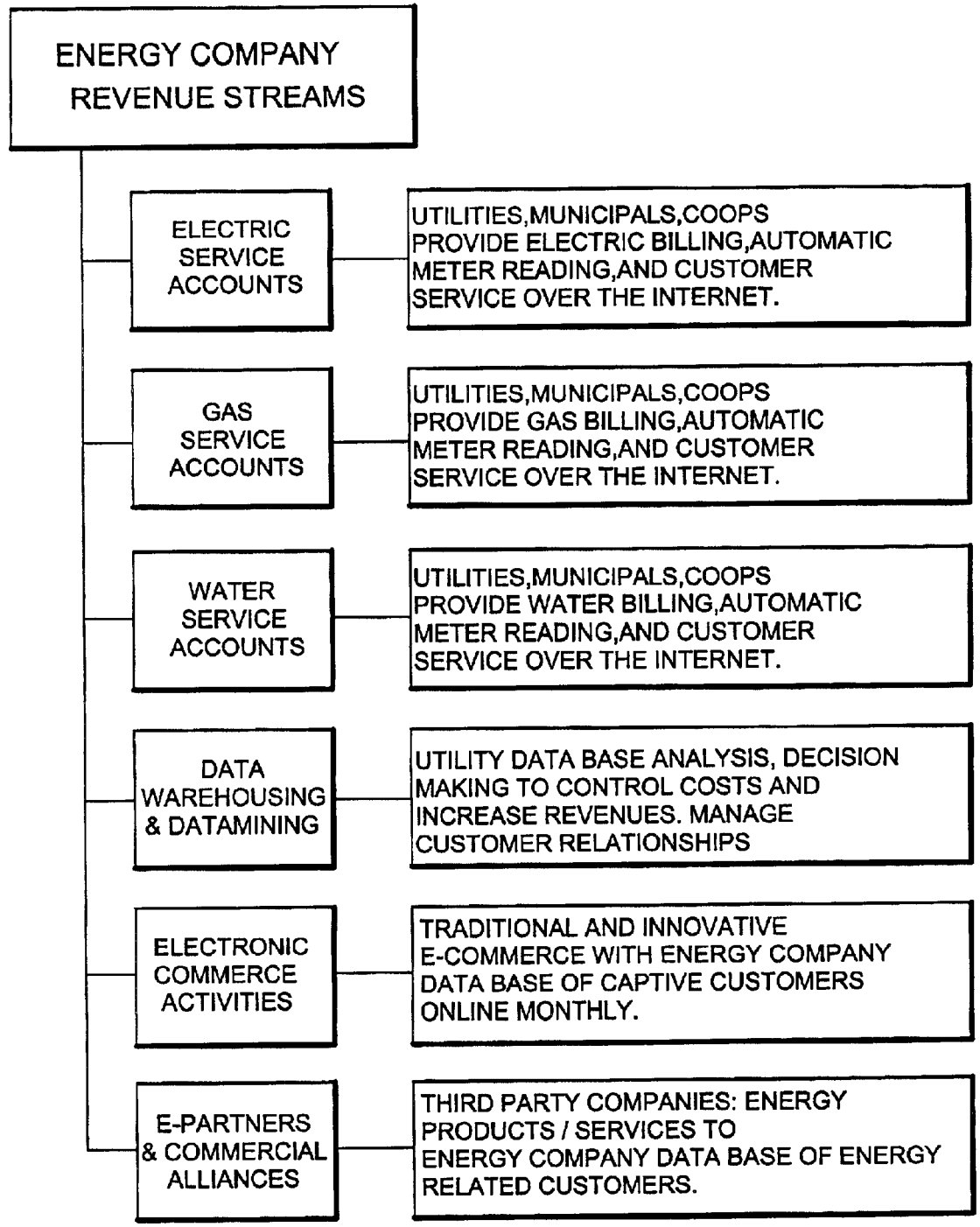
FIG. 10 is block diagram illustrating sources for data gathering by the system for reading a meter of the present invention.
Figure 11:
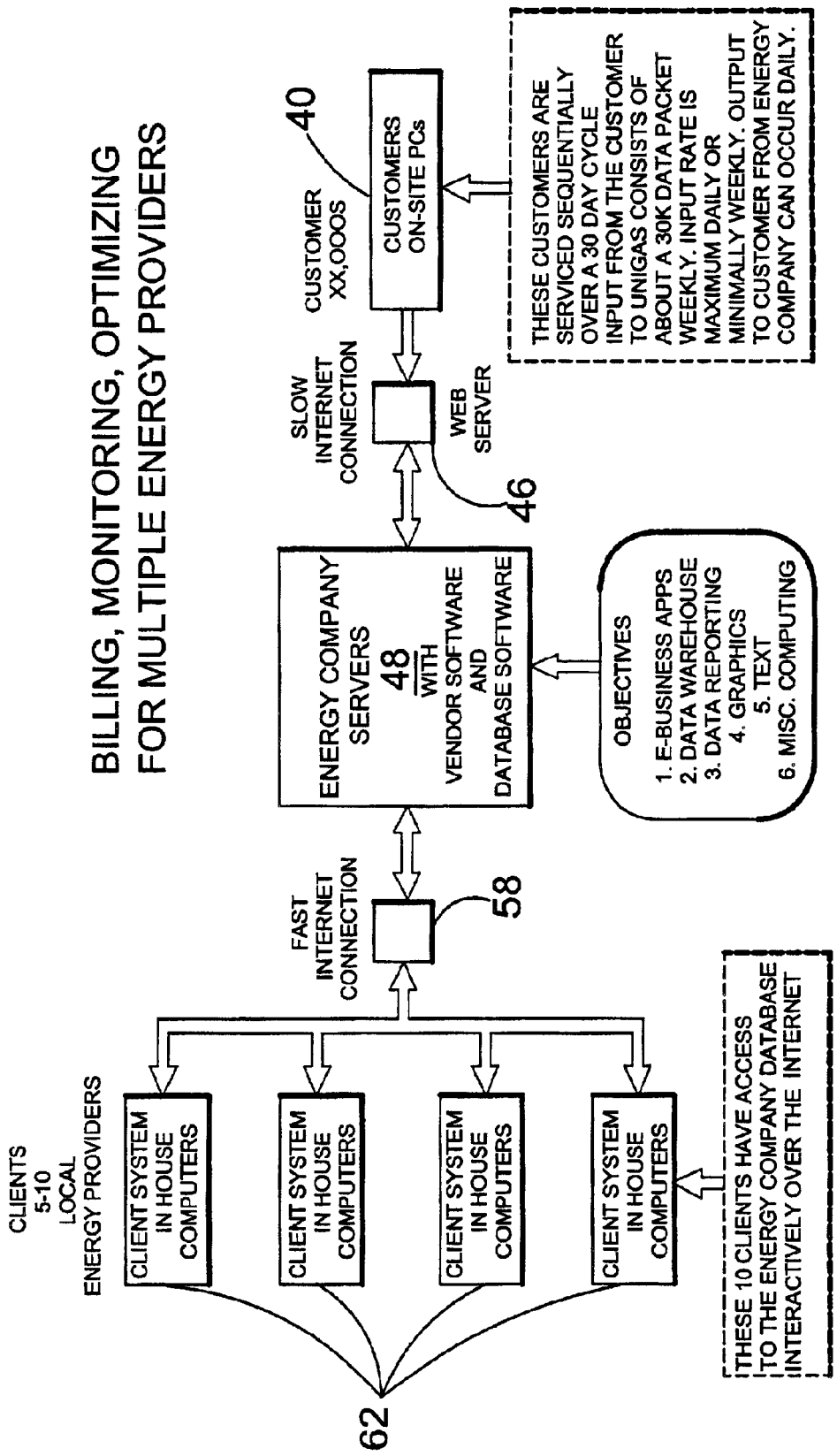
FIG. 11 is a block diagram illustrating billing and monitoring client usage of the monitored utility by the system for reading a meter of the present invention.
Figure 12:
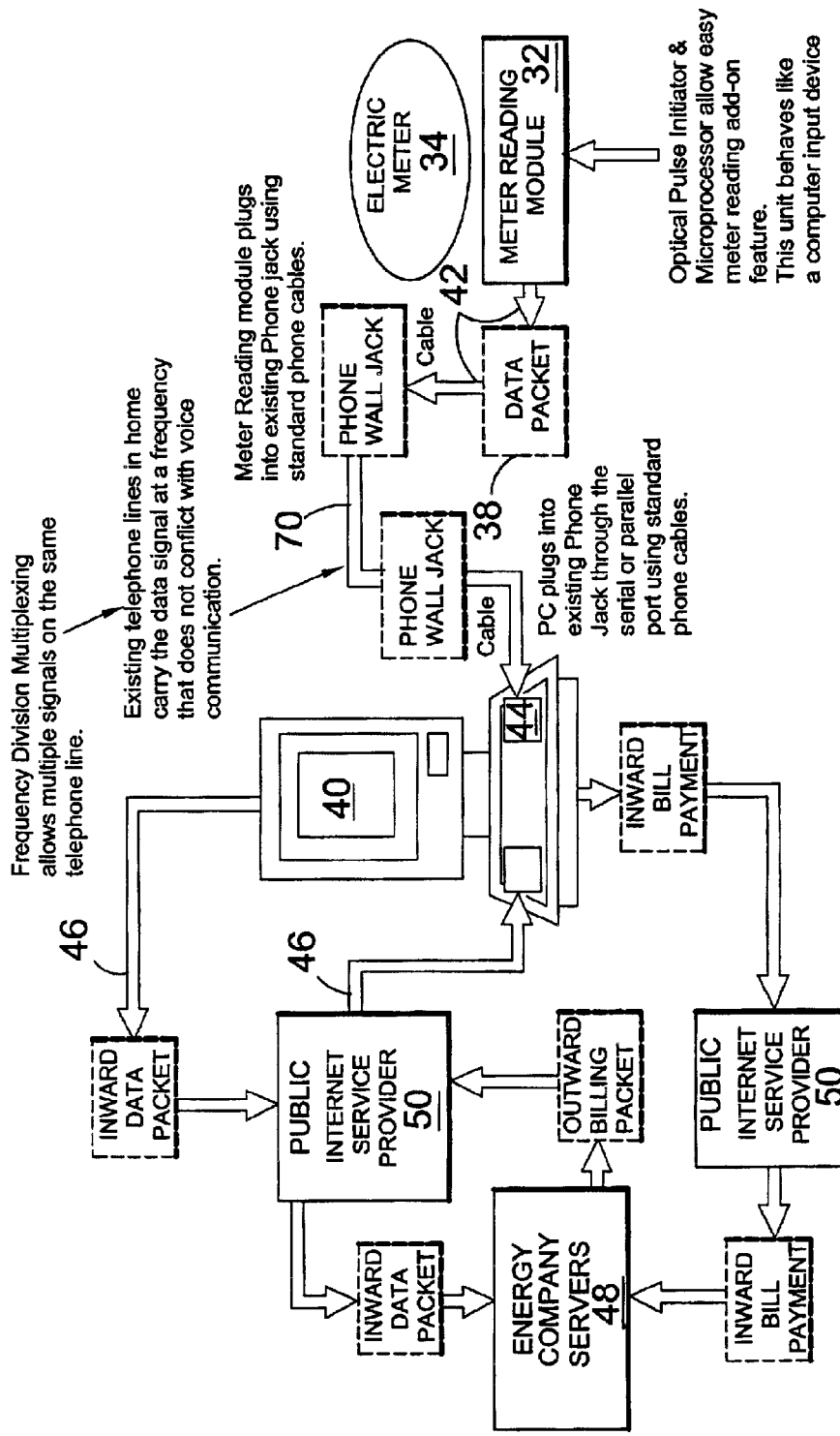
FIG. 12 is a block diagram illustrating electronic billing in accordance with the system for reading a meter of the present invention.

As can be seen from FIGS. 6, 9 and 11, the energy company computers 56 have stored programs that perform all the required monitoring, billing and commercial service operations required by the company. Usage data from several thousand end users are compiled into a database 58 which then forms the basis for many of the functions carried out in the processing operations. This data base 58 allows the stored computer programs in the machine 56 to develop bills and other service information which can then be sent via the connection 46 to the end user or via connection 60 to the utility company or power provider. The connection 60 is a high speed internet connection since many megabytes of data are transferred between the energy company computer 56 and the utility while the connection 46 to the end user is a typical slow internet connection which normally runs at speeds below 56 Kbps. The energy company 56 uses this massive database as a source of information for data mining and decision support in customer services and to optimize power generation operations.

Data mining is illustrated in FIGS. 9 and 11 and describes a process in which a computer program is used to develop business decisions using the patterns, cross references and other customer knowledge information that are extracted from the data warehouse or database, in this case the voluminous sets of historical and demographic data collected from the end users as they utilize the power, natural gas and water. In the system 30 of the present invention, data within the database is collected from the end users online and made available online to the analyst at the client utility company 62 in an interactive manner. This novel use of online data mining allows the client utility company 62 to target power use distribution and generation more efficiently over a smaller time horizon. In this embodiment as shown in FIG. 11, several client users 62 can access the databases of the energy company 36 simultaneously to use the databases for data mining. Since these databases are huge they require special high speed internet connections 58 and also larger than usual computers 48 to act as servers. In the preferred embodiment the servers 48 are top of the line workstations units which are able to handle the data flow and storage required by the system 30.

Figure 13:
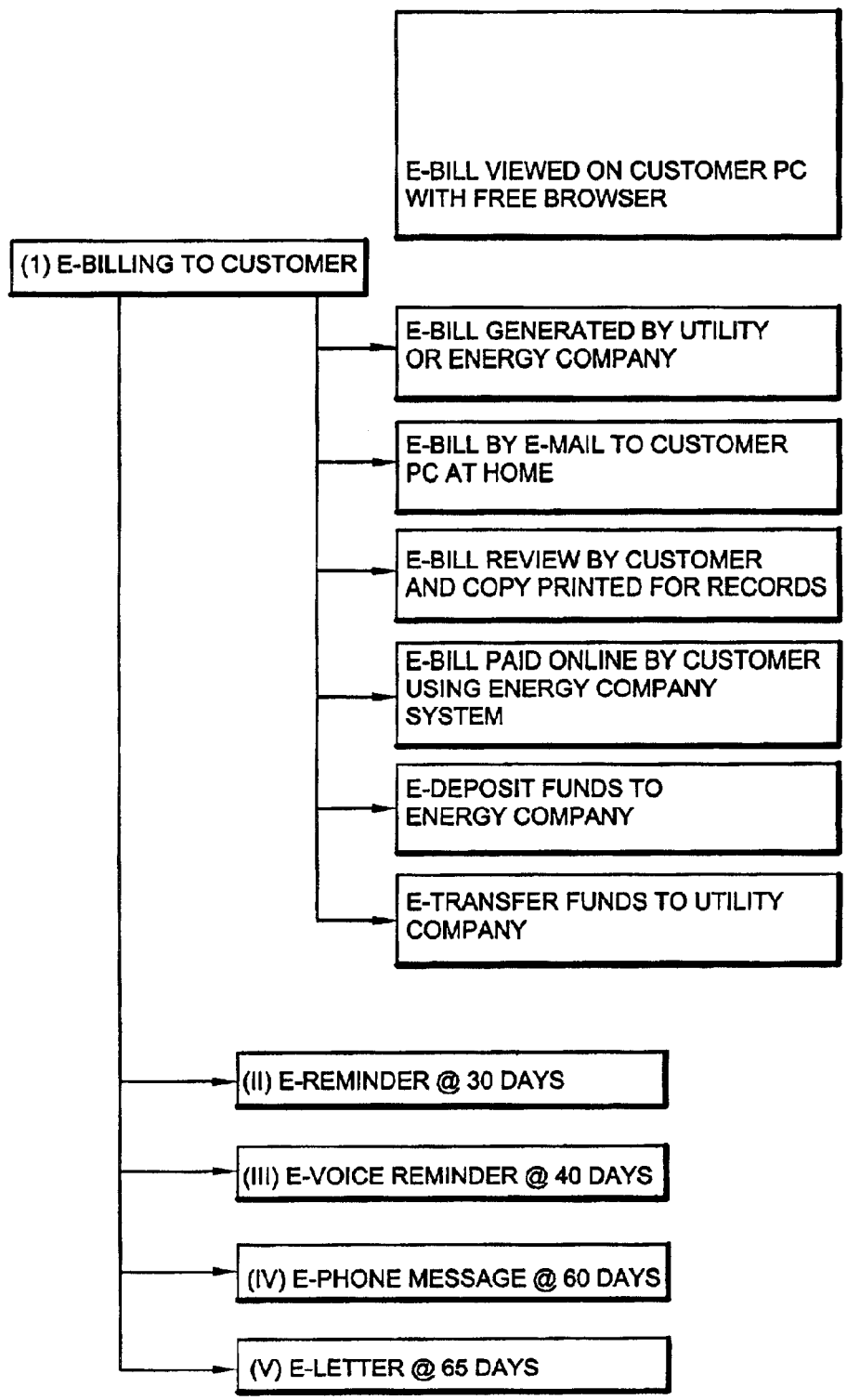
FIG. 13 is a block diagram illustrating electronic billing follow up procedures in accordance with the system for reading a meter of the present invention.

At a specified time during the month, the end user is sent an electronic bill or e-bill by the energy company computer as illustrated in FIG. 5 for a multiple residence building. This e-bill is transmitted as a graphical or text image from the computer 48 via the internet connection 66 to the customer computer 40. The e-bill arrives as a typical electronic mail message and the user can pay this bill electronically using a selection of pre-set options available interactively in the program. These options include, direct bank transfer, credit card or other type of financial instrument. In this embodiment the same technology is used to follow-up the e-bill over the internet to ensure payment by using follow-up email messages, voice mail messages, text messages and/or telephone messages as shown in FIG. 13. A system for providing bills to customers electronically as well as follow-up bills is illustrated in this figure. As shown in the figure, a bill is generated by the utility or energy company and sent to the PC 40 of a customer as an e-mail. This allows the customer an opportunity to review and printout a hard copy of the bill. The system 30 also provides the option of paying the bill online directly to the system, paying the bill via e-deposit funds or via e-transfer of finds. FIG. 6 illustrates payment of a bill via the system for reading a meter 30 to provide payment electronically to a bank. FIG. 7 illustrates the system for reading a meter 30 including a data path for electronic payment of a bill directly to the energy company. The system provides for reminders to be transmitted to the users PC as e-mails after 30 days, 40 days, 60 days and 65 days. The time periods for transmission of reminder e-mails can be changed based upon the desires of the company.

The system for reading a meter 30 of the present invention is also able to provide a validation of the utility bills provided to the customer. By statute, each utility has to publish a set of tariffs for its power sales to customers. These tariffs reflect the regulatory approved billing procedures for the customers. It is common knowledge that millions of dollars of incorrect billings are made each year and a cottage industry has developed to audit these bills and provide corrections to the customer. The system for reading a meter 30 allows all the tariff data to be resident online in the server computer and the resident programs than re-calculate the bill for each customer using the specific tariff relative to that customer and its actual indicated power use. The online calculation through the internet of the customer billing with data derived from an internet online reading of meter reading modules is a novel and innovative approach shown in this invention.

In the system for reading a meter 30 a combination of techniques are used to efficiently monitor and optimize the use of electrical power by an end user. The methodology involves the utilization of certain technologies. One such technology is Remote Meter Reading. Another technology is Internet Technology and a third technology is Optimization and Decision Making. The approach involves combining the subject methodologies to maximize operations, reduce costs, increase consumer service and optimize electric power operations simultaneously with a minimization of total operating costs.

Figure 14:
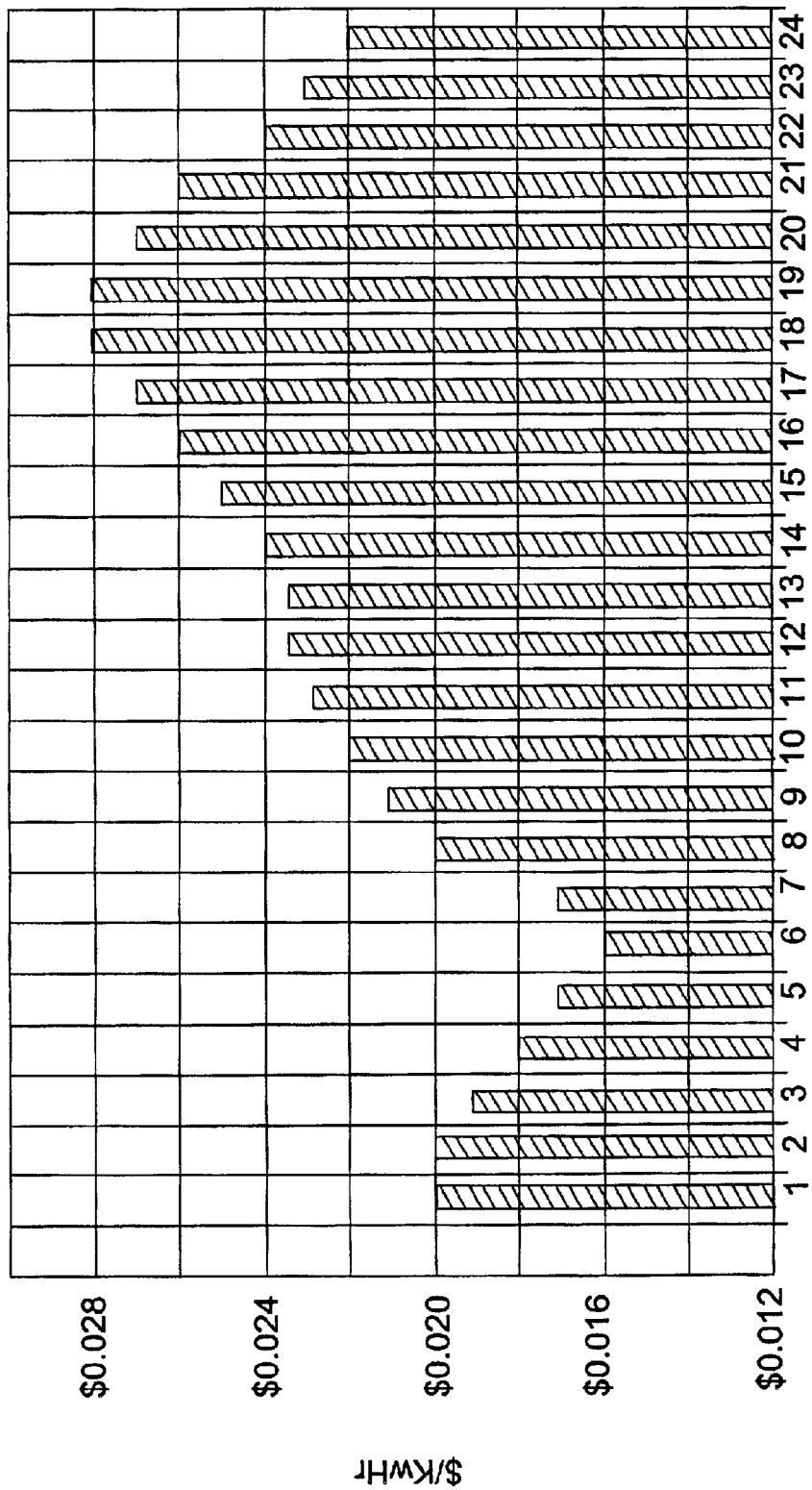
FIG. 14 is a graphical illustration of data input to a computer of the system for reading a meter of the present invention for efficiently monitoring and optimizing the use of electrical power by an end user.
Figure 15:
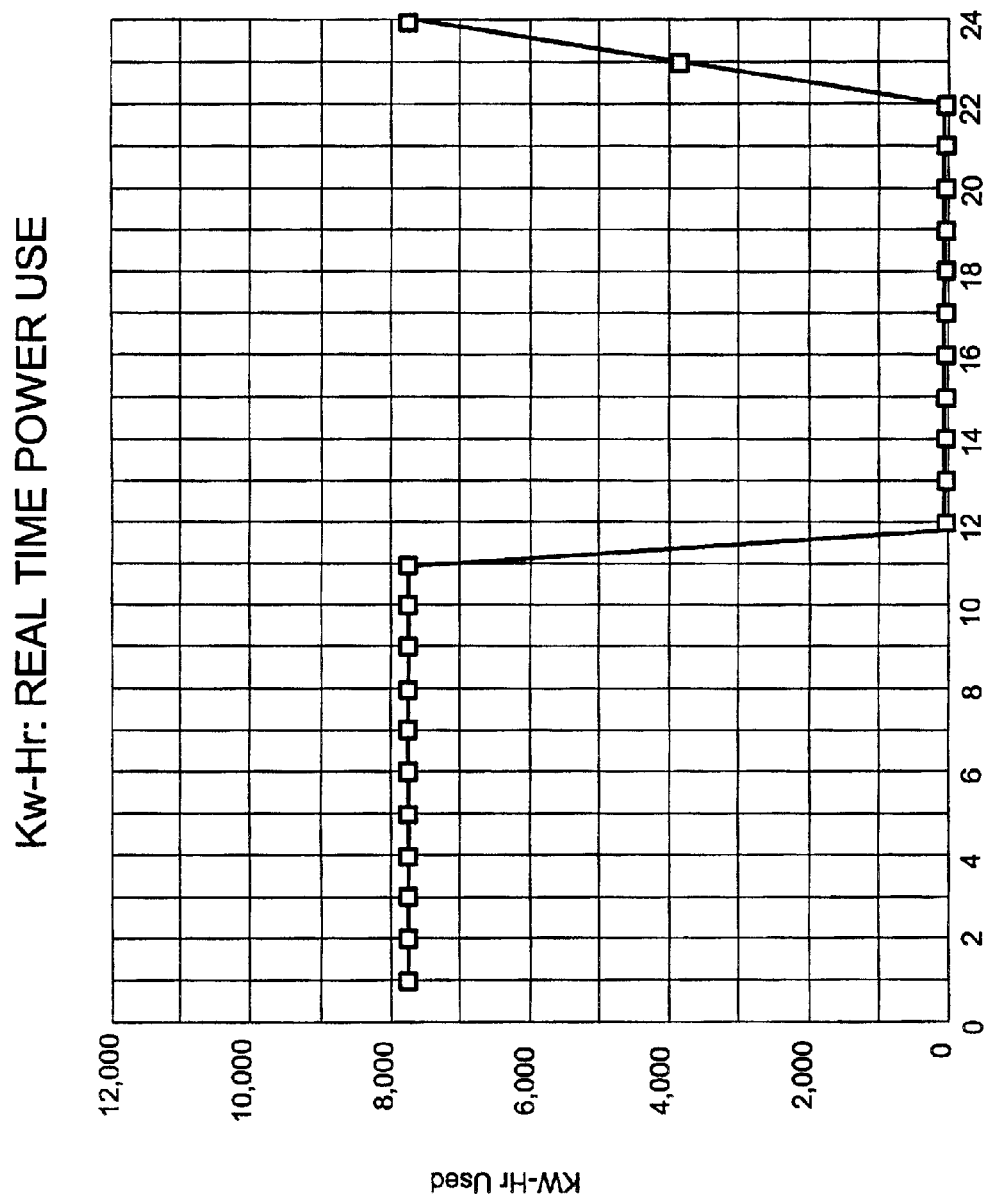
FIG. 15 is a graphical illustration of data output from the computer of the system for reading a meter of the present invention.
Figure 16:
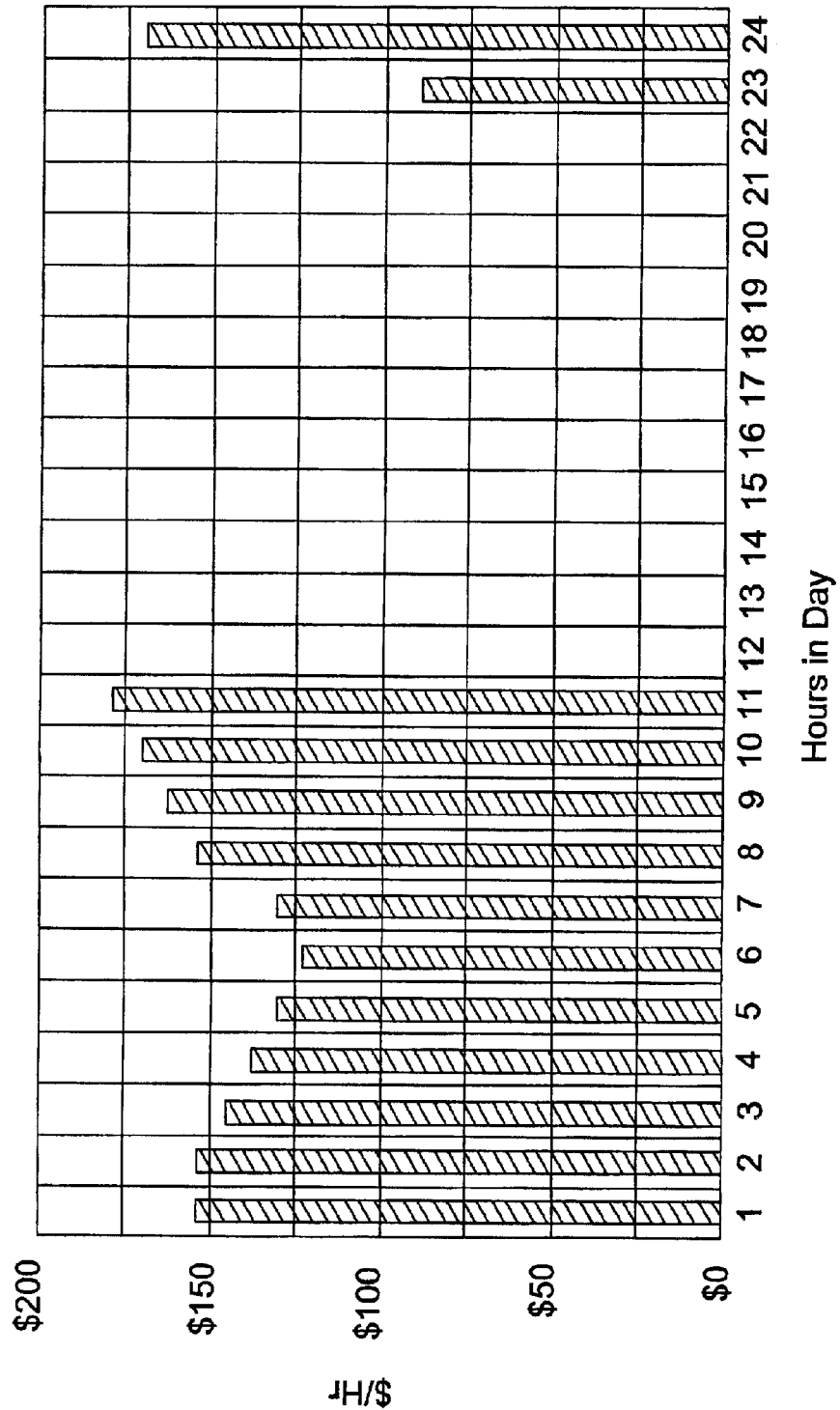
FIG. 16 is a graphical illustration of power cost data determined by the computer of the system for reading a meter of the present invention.

To provide this optimization, the internet server computers have a set of resident computer programs that are used to optimize the utilization of electric power by the customer based on the pricing tariff provide by the utility. In using this feature of the invention the procedure is as follows:

The program uses the real time pricing of the cost of electricity combined with the hourly use of electric power to formulate an optimization model which is solved online with accepted optimizing algorithms and computer routines to minimize total power costs within the operating constraints of the customer. In this analysis, the utility usually provides a time based schedule of its price of power. The computer program allocates the use of power within the limits of equipment operations such that the optimal power multiplied by the price is used while still providing all the work required by the customer. An example of data input to the computer program is shown in FIG. 14 while an example of data output from the computer is shown in FIGS. 15 and 16

The optimization procedure maximizes the use of electric power while at the same time minimizes the cost of power within the constraints of customer use. The optimization and decision making involved in the technology proposed herein is shown by the typical optimization submodel as follows:

For optimal use of electric power:

Objective Function (Z) represents the Total daily cost of power:

$$\text{Min}: Z = \sum_{i=1}^{24} KwHr_i \times RTP_i$$

this equation is subject to the following customer constraints:

$Qp_i < Q_{maxday}$ $Qp_i >= 0$ $Qp_i = f(Equipment_i, Appliances_i)$ – customer equipment
$Qp_i =< Qp_{max\ avail}$.
Wherein Z is the value of the objective function, and

| | |
|---|---|
| KwHr | Kilowatt hour used in any hour |
| RTP | Real time of day pricing data for electric power, $/KwHr |
| Qp | Kw rate/day |
| Qmax | Maximum KwHr rate |
| $Q_{maxday}$ | Maximum daily Kw use |
| "i" | subscript for time 'i' |

Optimal selections on hourly Kw use and equipment use allocation are combined in the global optimization process. There are several standard published techniques to solve this formulation of minimization problems. These include Linear Programming, Non Linear Programming and others. The solution technique is not part of this invention but the novelty of this invention is the incorporation of these algorithms in an online system driven by the Internet servers connected to the electric power consumer in a real time mode.

Output information produced by optimization technology in this invention is shown in the following graphical illustrations of FIGS. 14, 15 and 16. These figures show the Kw and KwHr used in a given time interval during a day period. These parameters are as follows.

(1) Real time pricing information from the utility company on the $/Kwhr for electricity sold.

(2) The Kw rate forecasted at each hour of the day to optimize the use of the system.

(3) The predicted KwHr to meet all system constraints and power use of the customer.

(4) The cumulative KwHr dispatched to the customer to meet the electric power needs of the system customers.

The operation of the system of the present invention will now be described with reference to the drawings. In operation, the meter reading module 32 is connected to read the meter 34 to determine an amount of use for the utility provided through the meter 34. When connected to read a gas or water meter, an encoder 56 may be connected between the meter reading module 32 and the meter 34. The preferred forms of meters for use with the system of the present invention are electrical, gas and water meters. However, the system of the present invention may be used to read any desired type of meter. The meter reading module 32 is connected to a personal computer 40 of the user of the utility. The personal computer 40 may be any type of computer with the only requirement being the ability to connect with the internet. The connection between the meter reading module 32 and the PC 40 may be through a hardwired connection, i.e. sent over the existing electric wiring in the building, X-10 technology, i.e. wireless, or sent over existing telephone lines at a frequency that does not interfere with other regular telephone communications. The PC 40 is connected to the utility company 36 computers through an internet service provider 50 and is able to transmit data read by the meter reading module 32 to the utility company 36.

Once the system 30 is connected, the meter reading module 32 periodically reads the consumption of the utility recorded by the meter 34. The read consumption amount is converted to a data signal and transmitted to the PC 40 for storage therein. If the PC is currently connected to the internet, the data is transmitted through the internet connection to the computer servers 48 of the utility company. The utility company is then able to determine the amount of utility used and bill the customer accordingly. If the PC 40 is not connected to the internet upon receipt of the data from the meter reading module 32, the data is stored by the PC 40 until the PC 40 ultimately connects to the internet. Upon connecting to the internet, the data is transmitted to the servers 48 of the utility company 36 in accordance with a program operating in a background environment of the PC 40 so as not to disturb the user. If the computer has not been connected to the internet over a prolonged or predetermined period of time, the utility company servers 36 contact the PC 40 causing the PC 40 to connect to the internet. Upon connecting to the internet, the data received from the meter reading module 32 and stored within the PC 40 is transmitted to the servers 48 across the internet connection.

From this data the utility company 36 is able to calculate a bill for usage of the utility. This bill is able to be electronically transmitted to the user over the internet as an e-mail message, Internet browser or other Internet related technologies and pay their bills automatically over the Internet via online banking protocols or other internet related payment technologies. The user is then able to review the bill and also pay the bill electronically. The user has the option of paying the bill electronically using a selection of pre-set options available interactively in the program. These options include, direct bank transfer, credit card or other type of financial instrument. The system is then able to follow-up the e-bill over the internet to ensure payment by using follow-up email messages, voice mail messages, text messages and/or telephone messages. The system generates a data warehouse having massive historical database of all the customer profiles collected by the system from the use of electric, natural and water resources by the utility customers for use by utility companies. The system is able to automatically optimize electric power use at the customer location by using a combination of linear and non-linear optimizing algorithms, the data warehouse, and "time of day" or "real time pricing per Kwhr" data, thereby allowing the customer to minimize total energy costs. The system also automatically determines the working status of the customer's electric, natural gas or water system over the internet during times of outages and other disaster related incidents via a connection through the PC 40.

From the above description it can be seen that the system for reading a meter of the present invention is able to overcome the shortcomings of prior art devices by providing a system which is able to read a meter such as an electric, natural gas or water meter at a customer location and transmit the meter information to a customer computer and then to the utility or energy company site using the Internet. The system is able to use the existing wiring in the customer location, existing telephone wires, a hard wire connection or wireless technology to carry the data signal from the meter to the customer PC. The natural gas and water meters can be read directly or by an encoder connected to the device and used to read the electric meter at the customer location. The system is able to automatically read one, two or three meter types simultaneously at the customer location. Additionally, the system is able to automatically signal the customer's PC, even when not connected to the Internet, wherein the utility server calls the customer's PC and signals the customer's machine telephone modem to connect to the Internet, thereby allowing for more efficient use of the internet by utilizing interactive two-way communication between customer and utility. The system provides a data warehouse having massive historical database of all the customer profiles collected by the system from the use of electric, natural and water resources by the utility customers for use by utility companies. The system automatically bills the customer over the Internet via e-mail, Internet browser or other Internet related technologies and pay their bills automatically over the Internet via online banking protocols or other internet related payment technologies. The system also automatically determines the working status of the customer's electric, natural gas or water system over the internet during times of outages and other disaster related incidents. The system is able to automatically optimize electric power use at the customer location by using a combination of linear and non-linear optimizing algorithms and "time of day" or "real time pricing per Kwhr" data, thereby allowing the customer to minimize total energy costs. Furthermore, the system for reading a meter of the present invention is simple and easy to use and economical in cost to manufacture.

It will be understood that each of the elements described above, or two or more together may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. A system for monitoring usage of a utility at a location remote from a utility company supplying the utility, said system comprising:
   a) a meter reading module connected to an existing utility meter for determining an amount of usage at the remote location and generating a data signal indicative of the determined amount of usage;
   b) an existing resident PC located at the remote location connected through a port in said PC to said meter reading module for recieving and storing usage information; and
   c) said PC having a resident program for automatically initiating and performing data transfer via an established internet connection of said PC to a server of the utility, said program working in the backround and unnoticed by a computer user of said PC during a login session to transmit stored usage information to said server of said utility.

2. The system as recited in claim 1, further comprising a plurality of meter reading modules, each of said plurality of meter reading modules reading a respective meter for determining utility usage within a respective residence at the remote location.

3. The system as recited in claim 1 having means for said server to use off the net technology to send a signal to modem of said PC when said PC is turned o but is not connected to the Internet to initiate a connection of said PC to the Internet by dialing an internet service provider to obtain transfer of usage data from said PC to said server.

4. The system as recited in claim 1, wherein said meter reading module is connected to said PC via one of a hardwired connection, X-10 technology or sent over existing telephone lines at a frequency that does not interfere with other regular telephone communications.

5. The system as recited in claim 4, wherein said hardwired connection is formed by existing electric wiring at the remote location.

6. The system as recited in claim 4, wherein said X10 technology is wireless.

7. The system as recited in claim 1, wherein said meter reading module is connected to one of an electrical, gas or water meter.

8. The system as recited in claim 7, further comprising an encoder device connected between said meter reading module and said gas meter.

9. The system as recited in claim 7, further comprising an encoder device connected between said meter reading module and said water meter.

10. The system as recited in claim 1, wherein the central location includes a processor for analyzing the data signal, generating a bill based upon a determined amount of usage and transmitting the bill to said PC in the form of one of an e-mail message, Internet browser or other Internet related technologies.

11. The system as recited in claim 10, wherein payment of the bill received from the processor is payable from said PC at the remote location.

12. The system as recited in claim 11, wherein payment of the bill by said PC at the remote location is performed automatically over the Internet via online banking protocols or other internet related payment technologies.

13. A method of monitoring usage of a utility at a location remote from a utility company supplying the utility, said method comprising the steps of:
   a) connecting a meter reading module to an existing utility meter;
   b) connecting the meter reading module to a port of a resident personal computer located at the remote location;
   c) reading the meter by the meter reading module;
   d) determining an amount of usage at the remote location;
   e) generating a data signal indicative of the determined usage by the meter reading module;
   f) transferring the data signal to said personal computer;
   g) said personal computer storing usage information;
   h) said personal computer using a resident program for automatically initiating and performing data transfer via an established internet connection of said personal computer to a server of said utility, said program working in the background and unnoticed by a user of said personal computer during a login session to transmit stored usage information to said server of said utility.

14. The method as recited in claim 13, wherein said personal computer stores the data signal from said meter reading module within a buffer therein prior to transmission to the central location for transmission.

15. The method as recited in claim 13, wherein said step of connecting the meter reading module connects a plurality of meter reading modules to a respective on of a plurality of meters for determining utility usage within a respective residence at the remote location, using a single personal computer for monitoring usage of multiple usage sites.

16. The method as recited in claim 13 in which said server uses off the net technology to send a signal to a modem of said PC when said PC is turned on but is not connected to the Internet to initiate a connection of said PC to the Internet by dialing an internet service provider to obtain transfer of usage from said PC to said server.

17. The method as recited in claim 13, wherein said step of connecting the meter reading module connects the meter reading module one of an electrical, gas or water meter.

18. The method as recited in claim 17, further comprising the step of connecting an encoder device between the meter reading module and meter.

19. The method as recited in claim 13, wherein said step of connecting the meter reading module to said personal computer is performed via one of a hardwired connection, X-10 technology or sent over existing telephone lines at a frequency that does not interfere with other regular telephone communications.

20. The method as recited in claim 19, wherein the hardwired connection is formed by existing electric wiring at the remote location.

21. The method as recited in claim 19, wherein said X10 technology is wireless.

22. The method as recited in claim 21, further comprising the step of generating a bill at the central location based upon a determined amount of usage.

23. The method as recited in claim 22, further comprising the step of transmitting the bill to said personal computer in the form of one of an e-mail message, Internet browser or other Internet related technologies.

24. The method as recited in claim 22, further comprising the step of paying the generated bill received from the central location from said personal computer at the remote location.

25. The method as recited in claim 24, wherein said step of paying the bill is performed automatically over the Internet via online banking protocols or other internet related payment technologies.

* * * * *